(12) United States Patent
Nisbet et al.

(10) Patent No.: US 12,476,600 B2
(45) Date of Patent: Nov. 18, 2025

(54) CURRENT CONDITIONING APPARATUS WITH NFET CURRENT MIRROR

(71) Applicant: SKYWORKS SOLUTIONS, INC., Irvine, CA (US)

(72) Inventors: John Jackson Nisbet, Ottawa (CA); Leslie Paul Wallis, Ottawa (CA); Guillaume Alexandre Blin, Carlisle, MA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 438 days.

(21) Appl. No.: 17/937,816

(22) Filed: Oct. 4, 2022

(65) Prior Publication Data

US 2023/0107607 A1 Apr. 6, 2023

Related U.S. Application Data

(60) Provisional application No. 63/252,449, filed on Oct. 5, 2021.

(51) Int. Cl.
*H03F 3/45* (2006.01)
*H03F 1/22* (2006.01)
*H03F 3/193* (2006.01)

(52) U.S. Cl.
CPC ..... *H03F 3/45273* (2013.01); *H03F 3/45632* (2013.01); *H03F 2203/45024* (2013.01); *H03F 2203/45116* (2013.01)

(58) Field of Classification Search
CPC ............ H03F 3/45273; H03F 3/45632; H03F 2203/45024; H03F 2203/45116
USPC ......................................... 330/277, 311, 257
See application file for complete search history.

(56) References Cited

U.S. PATENT DOCUMENTS

| | | | | |
|---|---|---|---|---|
| 9,438,175 B2* | 9/2016 | Onizuka | ................. | H03F 1/223 |
| 10,250,199 B2* | 4/2019 | Klaren | .................... | H03F 1/301 |
| 11,025,207 B2* | 6/2021 | Pal | ......................... | H03F 3/193 |

* cited by examiner

*Primary Examiner* — Hieu P Nguyen
(74) *Attorney, Agent, or Firm* — Lando & Anastasi, LLP

(57) ABSTRACT

Examples of the disclosure include a current-conditioning apparatus comprising a current mirror circuit including an input transistor adapted to receive an input current from an injection node and including an output transistor adapted to replicate in response to the received input current an output current with a predefined current mirror ratio, and a differential amplifier adapted to provide a negative feedback loop between the injection node of the apparatus and a control terminal of the input transistor of the current mirror circuit.

20 Claims, 3 Drawing Sheets

CURRENT CONDITIONING APPARATUS WITH NFET CURRENT MIRROR

CROSS-REFERENCE TO RELATED APPLICATIONS

This application claims priority under 35 U.S.C. § 119(e) to U.S. Provisional Application Ser. No. 63/252,449, titled "CURRENT CONDITIONING APPARATUS WITH NFET CURRENT MIRROR," filed on Oct. 5, 2021, which is hereby incorporated by reference in its entirety.

BACKGROUND

1. Field

Examples of the disclosure relate to a current conditioning apparatus which can be used in a signal amplifier or as a current source.

2. Discussion of Related Art

Current mirrors may be used in a wide range of applications. A current mirror circuit is a circuit that senses a reference current and generates one or more copies of the reference currents having the same or similar characteristics. The replicated electrical current can be the same as the reference current or it can be either a multiple or a fraction of the reference current. A basic parameter that describes the functionality of a current mirror circuit is its current gain or reflection coefficient. A current gain can be defined as a mirror ratio between the generated output current and the input reference current. The mirror ratio depends partially on process variations during the manufacturing process of the current mirror circuit and can depend also on the operating temperature of the current mirror circuit.

SUMMARY

According to at least one aspect of the disclosure, a current conditioning apparatus includes a current mirror circuit including an input transistor adapted to receive an input current from an injection node and including an output transistor adapted to replicate in response to the received input current an output current with a predefined current mirror ratio, and a differential amplifier adapted to provide a negative feedback loop between the injection node of the apparatus and a control terminal of the input transistor of the current mirror circuit.

In some examples, the output current provided by the output transistor of the current mirror circuit is supplied as a bias current to a multi-level cascode transistor stack of a signal amplifier. In at least one example, the multi-level cascode transistor stack of the signal amplifier includes at least three cascoded transistors with low breakdown voltages. In various examples, the control terminal of the input transistor of the current mirror circuit is connected via a first isolation resistor to a signal input of the signal amplifier. In some examples, a signal output of the signal amplifier is provided at the highest level of the multi-level cascode transistor stack of the signal amplifier.

In at least one example, the output transistor of the current mirror circuit is formed by a transistor at a first level of a multi-level cascode transistor stack of the signal amplifier. In various examples, the injection node is adapted to receive, from a reference current source of the apparatus, a reference current supplied as an input current to the input transistor of the current mirror circuit. In some examples, the injection node is connected via a reference transistor to the input transistor of the current mirror circuit. In at least one example, the reference transistor has a control terminal biased with a predefined bias voltage and connected via a second isolation resistor to a control terminal of a transistor at the second level of a multi-level cascode transistor stack.

In various examples, the reference transistor and the transistor at the second level of the multi-level cascode transistor stack form a second current mirror circuit of the apparatus having the same predefined current mirror ratio as the first current mirror circuit of the current conditioning apparatus. In some examples, the differential amplifier includes a third current mirror circuit connected via resistors to a transistor pair including a first transistor having a control terminal connected to the injection node and including a second transistor having a control terminal biased with the same bias voltage as the control terminal of a reference transistor of a second current mirror circuit of the current conditioning apparatus.

In at least one example, the differential amplifier includes a safety circuit provided to maintain a voltage drop along each transistor of the differential amplifier within a safe operation voltage range. In various examples, the differential amplifier is enabled or disabled in response to an enable control signal applied to a control terminal of a first enable transistor of the differential amplifier being connected via a transistor and resistors to an input transistor of a fourth current mirror circuit provided in the differential amplifier and applied to a control terminal of a second enable transistor of the differential amplifier being connected to an input transistor of a third current mirror circuit provided in the differential amplifier. In some examples, an output transistor of the fourth current mirror circuit provided in the differential amplifier is connected to a control terminal of a transistor connected in series with a first transistor of a transistor pair provided in the differential amplifier.

In at least one example, the negative feedback loop of the differential amplifier includes capacitors connected to the injection node to provide frequency stability to the negative feedback loop. In various examples, the first current mirror circuit comprises N-MOSFETs. In some examples, a second current mirror circuit and a third current mirror circuit provided in the differential amplifier comprise N-MOSFETs. In at least one example, a fourth current mirror circuit provided in the differential amplifier comprise P-MOSFETs.

According to at least one aspect of the disclosure, a signal amplifier includes a multi-level cascode transistor stack with a quiescent bias current provided by a current conditioning apparatus having a current mirror circuit including an input transistor adapted to receive an input current from an injection node and including an output transistor adapted to provide in response to the received input current a replicated output current with a predefined current mirror ratio and having a differential amplifier adapted to provide a negative feedback loop between the injection node and a control terminal of the input transistor of the current mirror circuit.

According to at least one aspect of the disclosure, a current source includes a current conditioning apparatus having a current mirror circuit including an input transistor adapted to receive an input current from an injection node and including an output transistor adapted to provide in response to the received input current a replicated output current with a predefined current mirror ratio and having a differential amplifier adapted to provide a negative feedback loop between the injection node and a control terminal of the input transistor of the current mirror circuit.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Figure 1:
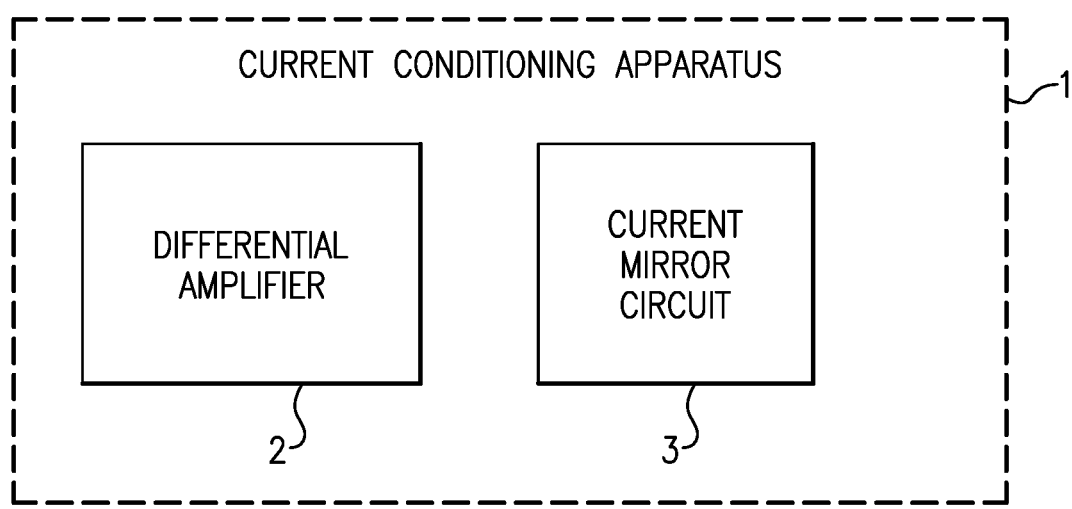
FIG. 1 illustrates a schematic diagram of a current conditioning apparatus according to an example.

The following detailed description of certain embodiments presents various descriptions of specific embodiments. However, the innovations described herein can be embodied in a multiple of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

As discussed above, a current mirror circuit is a circuit that senses a reference current and generates one or more copies of the reference currents having the same or similar characteristics. A current mirror circuit can be obtained from one transistor current source by using a second transistor in diode connection that generates a necessary gate source voltage of the transistor in the output stage. The gate source voltage is set by the diode geometry and the injected input or reference current. Since the gates and sources of the transistors are connected together in the current mirror circuit, the gate source voltage of the current source is equal to the gate source voltage of the diode. A current mirror circuit can be used to set a quiescent bias current in a power amplifier. A current mirror circuit can further be used to set an operating current bias in a multi-level cascode stack of the power amplifier.

Figure 2:
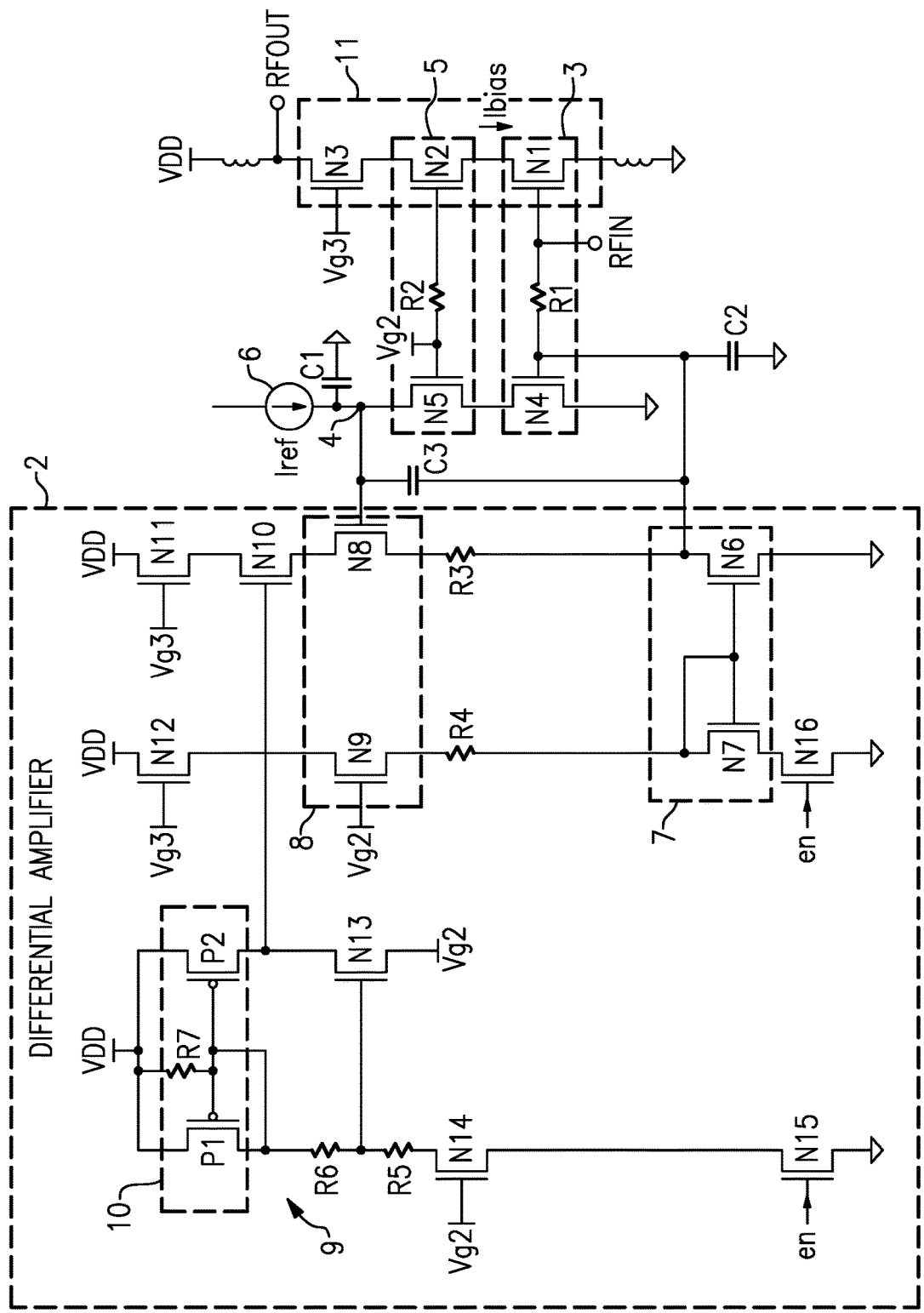
FIG. 2 illustrates a circuit diagram of a current conditioning apparatus according to an example.

FIG. 1 illustrates a block diagram of a current conditioning apparatus 1 according to an example. The current conditioning apparatus 1 includes a differential amplifier 2 and a current mirror circuit 3 coupled to the differential amplifier 2. The current mirror circuit 3 can include an input transistor adapted to receive an input current from an injection node 4 as shown in FIG. 2. The current mirror circuit 3 may further include an output transistor adapted to replicate, in response to the received input current, an output current with a predefined current mirror ratio M. The current mirror circuit 3 is connected to the differential amplifier 2 illustrated in the schematic block diagram of FIG. 1. The differential amplifier 2 is adapted to provide a negative feedback loop between the injection node 4 of the current conditioning apparatus 1 and a control terminal of the input transistor of the current mirror circuit 3. The output current provided by the output transistor of the current mirror circuit 3 can be supplied in a possible embodiment as a bias current to a multi-level cascode transistor stack of a signal amplifier.

FIG. 2 illustrates a schematic diagram of a current conditioning apparatus 1 including a differential amplifier 2 and a current mirror circuit 3 according to an example. In the illustrated example of FIG. 2, the current mirror circuit 3 is used to provide a bias current for a multi-level cascode transistor stack 11 of a signal amplifier 12 as also illustrated in the block diagram of FIG. 4. The multi-level cascode transistor stack 11 of the signal amplifier 12 includes cascoded transistors with low breakdown voltages, the number of cascoded transistors being selected based on the use case.

In the illustrated example of FIG. 2, the multi-level cascode transistor stack 11 of the signal amplifier 12 comprises three cascoded transistors N1, N2, N3 each having a low breakdown voltage of, for example, less than 1.5 V. The current mirror circuit 3 comprises an input transistor N4 connected via a resistor R1 to an output transistor N1. The input transistor N4 of the current mirror circuit 3 is adapted to receive an input current from an injection node 4 as shown in FIG. 2. The output transistor N1 of the current mirror circuit 3 is adapted to replicate, in response to a received input current, an electrical output current with a predefined current mirror ratio M used in the illustrated example as a bias current for the multi-level cascode transistor stack 11 of the signal amplifier 12 including the three cascoded transistors N1, N2, N3.

A control terminal of the input transistor N4 of the current mirror circuit 3 is connected via the first isolation resistor R1 to a signal input RFIN of the signal amplifier 12 as illustrated in FIG. 2. A signal output RFOUT of the signal amplifier 12 is provided at the highest level of the multi-level cascode transistor stack 11 as shown in FIG. 2. A coil can be provided between the signal output RFOUT and the supply voltage terminal as shown in FIG. 2. The output transistor N1 of the current mirror circuit 3 is formed by the transistor N1 provided at a first level of the multi-level cascode transistor stack 11 of the signal amplifier 12.

In the example illustrated in FIG. 2, the injection node 4 may be adapted to receive, from a reference current source 6 of the apparatus 1, a reference current supplied as an electrical input current to the input transistor N4 of the current mirror circuit 3. In the illustrated example, the injection node 4 is connected via a reference transistor N5 to the input transistor N4 of the current mirror circuit 3. The reference transistor N5 has a control terminal biased with a predefined bias voltage and is connected via a second isolation resistor R2 to a control terminal of a transistor N2 at the second level of the multi-level cascode transistor stack 11 of the signal amplifier 12. The reference transistor N5 and the transistor N2 at the second level of the multi-level cascode transistor stack form, in the illustrated example, a second current mirror circuit 5 of the current conditioning apparatus 1 having the same predefined current mirror ratio M as the first current mirror circuit 3 of the current conditioning apparatus 1.

In some examples, the reference transistor N5 and the transistor N2 of the second current mirror circuit 5 have the same gate-width ratio as the transistors N4 and N1 of the first current mirror circuit 3. The second isolation resistor R2 shown in FIG. 2 is provided to keep RF energy from leaking into the bias circuit. The reference current source 6 as shown in FIG. 2 is sourced in the illustrated example into the drain terminal of the reference transistor N5. The control terminal of the reference transistor N5 is biased with the predefined bias voltage Vg2 as shown in FIG. 2. This arrangement provides an accurate current scaling for all reasonable values of the bias voltage Vg2 and the reference current $I_{ref}$ provided by the reference current source 6.

The current mirror circuit 3 is connected to the differential amplifier 2. The differential amplifier 2 of the current conditioning apparatus 1 comprises in the illustrated example of FIG. 2 a third current mirror circuit 7 connected via resistors R3, R4 to a transistor pair 8 of the differential amplifier 2. The third current mirror circuit 7 comprises transistors N7, N6 as shown in FIG. 2. The transistor pair 8 comprises transistors N9, N8 as also shown in FIG. 2. The transistor pair 8 includes a first transistor N8 having a control terminal connected to the injection node 4. The transistor pair 8 further comprises a second transistor N9 having a control terminal biased with the same bias voltage Vg2 as the control terminal of the reference transistor N5 of the second current mirror circuit 5 within the current conditioning apparatus 1.

In the illustrated example of FIG. 2, the differential amplifier 2 further comprises a safety circuit 9 to maintain a voltage drop along each transistor of the differential amplifier 2 within a safe operation voltage range. The differential amplifier 2 can be enabled or disabled in response to an enable control signal EN applied to a control terminal of a first enable transistor N15 of the differential amplifier 2 being connected via a transistor N14 and resistors R5, R6 to an input transistor P1 of a fourth current mirror circuit 10 of the safety circuit 9 of the differential amplifier 2. The enable control signal EN is also applied to a control terminal of a second enable transistor N16 of the differential amplifier 2 being connected to the input transistor N7 of the third current mirror circuit 7 of the differential amplifier 2.

The fourth current mirror circuit 10 comprises the input transistor P1 and an output transistor P2 as shown in FIG. 2. The output transistor P2 of the fourth current mirror circuit 10 of the differential amplifier 2 is connected in the illustrated example to a control terminal of a transistor N10 connected with the transistor N8 of the transistor pair 8 provided in the differential amplifier 2.

When the mirror circuit is enabled, the enable transistors N15, N16 can switch on with a very low $V_{ds}$. Transistor N8 and resistor R3 work with transistor N9 and resistor R4 and the third current mirror circuit 7 and the cascoded transistors N4, N5 as a high-gain current-differencing amplifier. This feedback loop to the control terminal of transistor N8 sets the control terminal of transistor N8 at the bias voltage Vg2. A resistor R3 can be used to fine-tune the exact gate voltage of transistor N8 which forms also the drain voltage of transistor N5. This voltage may be varied at least within a range that respects the compliance of the reference current source 6 and the cascode including the transistors N4, N5.

The negative feedback loop provided by the differential amplifier 2 of the current conditioning apparatus 1 comprises in a possible example capacitors C1, C3 connected to the injection node 4 to provide frequency stability to the negative feedback loop. The capacitors C1, C3 compensate the feedback loop for frequency stability while the capacitor C2 also shown in FIG. 2 provides additional RF isolation from the RF cascode transistor stack N1 to N3. The gate of the transistor N10 connected in series with the first transistor N8 of the transistor pair 8 can be pulled to the supply voltage $V_{DD}$ so that it has a very small $V_{ds}$ drop. This may set Vd8=Vd9=Vg3−Vgs3 for a desired matching.

The safety circuit 9 of the differential amplifier 2 is provided to guarantee that all $V_{ds}$ voltages remain below maximum reliable values under disabled conditions while allowing maximum voltage headroom under enabled conditions of the differential amplifier 2. When the differential amplifier 2 is enabled electrical currents flow in transistor N14 and resistors R5, R6. The current mirror circuit 10 including the transistors P1, P2 can pull the gate of the transistor N10 to the supply voltage $V_{DD}$. When disabled, the resistor R7 pulls the control terminals of transistors P1, P2 of the fourth current mirror circuit 10 and of transistor N13 to the supply voltage $V_{DD}$, thereby turning off the fourth current mirror circuit 10 and connecting the control terminal of transistor N10 to the bias voltage Vg2. Because the transistor N16 is not conducting, the control terminal of transistor N6 is pulled up to the voltage Vg2 and the control terminals of transistor N4 and transistor N8 are both pulled to ground. This does minimize leakage current while maintaining all transistors with safe gate source voltage $V_{gs}$ and safe drain source voltage $V_{ds}$.

The matching of the transistors N1, N4 of the first current mirror circuit 3 and of the transistors N2, N5 of the second current mirror circuit may be set as close as possible. The other transistors need not be low-voltage transistors in some examples as long as a good matching is maintained for the transistors N6, N7 of the third current mirror circuit 7, the transistors N8, N9 of the transistor pair 8 and the transistors P1, P2 of the fourth current mirror circuit 10. In a possible example, this allows the mirror and safety circuit to be placed at some distance from the cascode transistor stacks, with only transistors N4, N5 and resistors R1, R2 placed near to the RF core of the RF transistor stack including the transistors N1, N2, N3. This in turn allows for a tight RF layout with good DC matching and minimal risk of unwanted RF coupling to the bias circuit of the signal amplifier. In the illustrated example of FIG. 2, the current-differencing amplifier is used to provide a negative feedback loop between the injection node 4 of the current conditioning apparatus 1 and the control terminal of the input transistor N4 of the first current mirror circuit 3. In a possible example, any high-gain differential amplifier can be used as long as it provides a negative feedback between the injection node 4 and the control terminal of the input transistor N4 of the current mirror circuit 3 with the voltage Vg2 as a reference.

Figure 3:
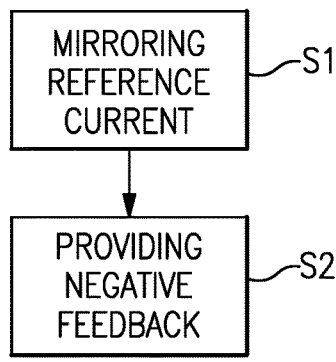
FIG. 3 illustrates a flowchart of a method of generating a current using a current conditioning apparatus according to an example.

In the example illustrated in FIG. 3, the transistors are mostly implemented as NMOS field effect transistors FET. However, the topology of the circuit can be inverted by swapping N-MOSFETs to P-MOSFETs and vice versa which can be useful in various examples, such as where transistors N1 to N5 are replaced with bipolar junction transistors. The current conditioning apparatus 1 according to one example can be used for different stack heights comprising more than three cascode transistors in the multi-level cascode transistor stack of the signal amplifier. In the current conditioning apparatus 1 shown in FIG. 2 the first current mirror circuit 3 comprises N-MOSFETs. Further the second current mirror circuit 5 and the third current mirror circuit 7 provided in the differential amplifier 2 comprise N-MOSFETs. The fourth current mirror circuit 10 provided in the differential amplifier 2 comprises P-MOSFETs.

In a possible alternative embodiment of the current conditioning apparatus 1 the N-MOSFETS can be substituted by P-MOSFETs and the P-MOSFETS by N-MOSFETs. If MOSFETs are used the control terminals may be formed by gate terminals of the MOSFETs.

In a still further example of the current conditioning apparatus 1 the implemented transistors of the current conditioning apparatus 1 comprise bipolar transistors. In case that bipolar transistors are used the control terminals are formed by the base terminals of the bipolar transistors.

The current conditioning apparatus 1 provides for a precise current matching ratio M independent of the manufacturing process and temperature T when enabled. The current conditioning apparatus 1 further ensures safe drain source voltage conditions for all transistors within the circuit when disabled.

Figure 4:
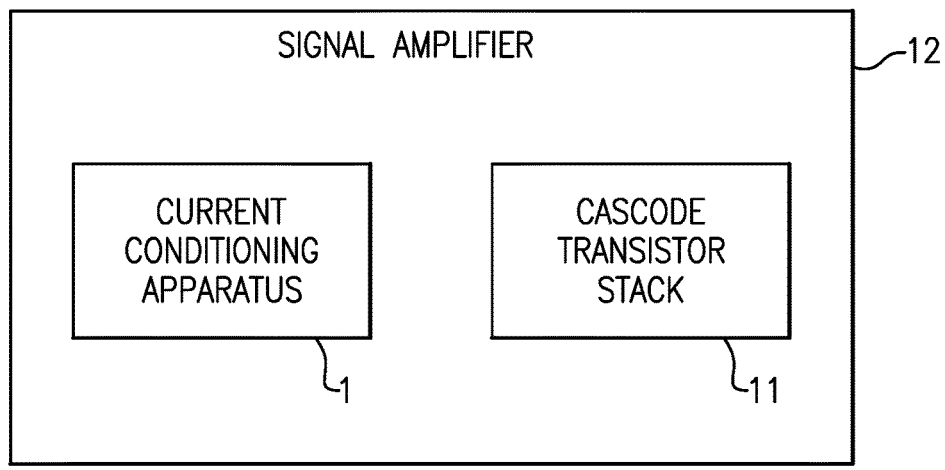
FIG. 4 illustrates a block diagram of a signal amplifier comprising a current conditioning apparatus according to an example.

The current conditioning apparatus 1 as shown in the circuit diagram of FIG. 2 provides in a possible example a quiescent bias current for a signal amplifier 12 having a multi-level cascode transistor stack 11 as shown in the block diagram of FIG. 4. In the example shown in FIG. 2, the signal amplifier 12 comprises a multi-level cascode transistor stack 11 including three transistors N1, N2, N3 wherein the quiescent bias current is provided by the current conditioning apparatus 1.

Figure 5:
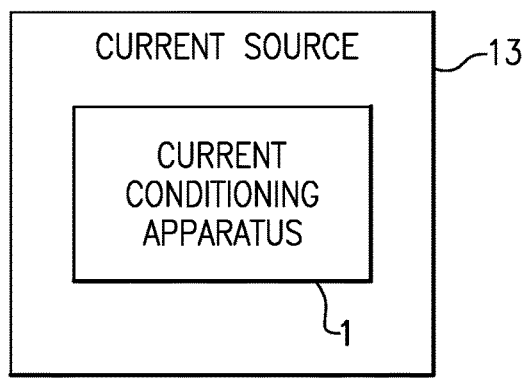
FIG. 5 illustrates a block diagram of a current source comprising a current conditioning apparatus according to an example.

The current conditioning apparatus 1 according to the present disclosure can also be used in a current source 13 as shown in the block diagram of FIG. 5. The current source 13 can comprise a current conditioning apparatus 1 as illustrated in FIGS. 1, 2 having a current mirror circuit 3 including the input transistor N4 adapted to receive an input current from an injection node 4 and including an output transistor N1 adapted to provide, in response to the received input current, a replicated output current with a predefined current mirror ratio M. The current conditioning apparatus 1 of the current source 13 comprises also a differential amplifier 2 adapted to provide a negative feedback loop between the injection node 4 and the control terminal of the input transistor N4 of the current mirror circuit 3.

FIG. 3 illustrates a simple flowchart of a possible example of a method for generating a current. In the illustrated example, the method comprises two main steps.

In a first step S1, a reference current supplied from an injection node 4 to an input transistor of a current mirror circuit 3 is mirrored to generate by an output transistor of the current mirror circuit 3 a replicated output current with a predefined current ratio M.

In a second step S2, a negative feedback between the injection node 4 and a control terminal of the input transistor of the current mirror circuit 3 is provided. In some examples, the negative feedback is provided by the differential amplifier 2.

Additional transistors can be provided to increase the operation lifetime. As illustrated in the circuit diagram of FIG. 2, the differential amplifier 2 may comprise additional transistors N11, N12 to increase the operation lifetime of the current conditioning apparatus 1. The supply voltage $V_{DD}$ can comprise for instance a voltage in a range of 2 V to 3 V. The breakdown voltages of the transistors implemented in the current conditioning apparatus 1 can be for instance lower than 1.5 V.

The current conditioning apparatus 1 can be used in millimeter-wave power amplifiers using transistors with low breakdown voltages to handle high-voltage signals. In some examples, the current mirror circuit 3 of the current conditioning apparatus 1 provides a very precise current mirror ratio M being widely independent from process parameters of the manufacturing process. Further, the current mirror ratio M of the current conditioning apparatus 1 may be robust against temperature changes. The bias voltages applied to the transistors of the current conditioning apparatus 1 may be well below the transistors' maximum safe values in both enabled and disabled states of the current conditioning apparatus 1. The current conditioning apparatus 1 provides a reliable and good mirror ratio control and provides good voltage compliance. Further, the transistors of the current conditioning apparatus 1 may not undergo significant voltage stress.

FIG. 4 shows an example of a signal amplifier 12 comprising a multi-level cascode transistor stack 11 with a quiescent bias current provided by a current conditioning apparatus 1. The current conditioning apparatus 1 has a current mirror circuit 3 including an input transistor N4 adapted to receive an input current from an injection node 4 and including an output transistor N1 adapted to provide in response to the received input current a replicated output current with a predefined current mirror ratio M. The current conditioning apparatus 1 further comprises a differential amplifier 2 adapted to provide a negative feedback loop between the injection node 4 and a control terminal of the input transistor N4 of the current mirror circuit 3 of the current conditioning apparatus 1.

FIG. 5 shows an example of a current source 13 comprising a current conditioning apparatus 1 having a current mirror circuit 3 including an input transistor N4 adapted to receive an input current from an injection node 4 and including an output transistor N1 adapted to provide in response to the received input current a replicated output current with a predefined current mirror ratio M and having a differential amplifier 2 adapted to provide a negative feedback loop between the injection node 4 and a control terminal of the input transistor N4 of the current mirror circuit 3.

The examples described above have provided examples in connection with a signal amplifier. However, the principles and advantages of the disclosure can be used for any other systems or apparatus that may implement signal amplifiers or any kind of current conditioning circuit.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled," as generally used herein, refers to two or more elements that may be either directly connected, or connected by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as," and the like, unless specifically stated otherwise, or otherwise understood within the context as used, is generally intended to convey that certain examples include, while other examples do not include, certain features, elements and/or states. Thus, such conditional language is not generally intended to imply that features, elements and/or states are in any way required for one or more examples or that one or more examples necessarily include logic for deciding, with or without author input or prompting, whether these features, elements and/or states are included or are to be performed in any particular example.

The above detailed description of examples of the disclosure is not intended to be exhaustive or to limit the disclosure to the precise form disclosed above. While specific embodiments of, and examples for, the disclosure are described above for illustrative purposes, various equivalent modifications are possible within the scope of the disclosure, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the disclosure provided herein can be applied to other systems, not necessarily the system described above. The elements and acts of the various examples described above can be combined to provide further examples.

While certain examples of the disclosure have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A current conditioning apparatus comprising:
a first current mirror circuit including
an input transistor adapted to receive an input current from an injection node, and
an output transistor adapted to replicate in response to the received input current an output current with a predefined current mirror ratio, the output current being supplied as a bias current to a multi-level cascode transistor stack of a signal amplifier; and
a differential amplifier including at least one differential amplifier current mirror circuit, the differential amplifier being adapted to provide a negative feedback loop between the injection node of the apparatus and a control terminal of the input transistor of the first current mirror circuit.

2. The current conditioning apparatus of claim 1 wherein the multi-level cascode transistor stack of the signal amplifier includes at least three cascoded transistors with low breakdown voltages.

3. The current conditioning apparatus of claim 1 wherein the control terminal of the input transistor of the first current mirror circuit is connected via a first isolation resistor to a signal input of the signal amplifier.

4. The current conditioning apparatus of claim 1 wherein a signal output of the signal amplifier is provided at a highest level of the multi-level cascode transistor stack of the signal amplifier.

5. The current conditioning apparatus of claim 1 wherein the output transistor of the first current mirror circuit is formed by a transistor at a first level of the multi-level cascode transistor stack of the signal amplifier.

6. The current conditioning apparatus of claim 1 wherein the injection node is adapted to receive, from a reference current source of the apparatus, a reference current supplied as an input current to the input transistor of the first current mirror circuit.

7. The current conditioning apparatus of claim 1 wherein the injection node is connected via a reference transistor to the input transistor of the first current mirror circuit.

8. The current conditioning apparatus of claim 7 wherein the reference transistor has a control terminal biased with a predefined bias voltage and connected via a second isolation resistor to a control terminal of a transistor at a second level of the multi-level cascode transistor stack.

9. The current conditioning apparatus of claim 8 wherein the reference transistor and the transistor at the second level of the multi-level cascode transistor stack form a second current mirror circuit of the apparatus having the same predefined current mirror ratio as the first current mirror circuit of the current conditioning apparatus.

10. The current conditioning apparatus of claim 1 wherein the at least one differential amplifier current mirror circuit includes a third current mirror circuit connected via resistors to a transistor pair including a first transistor having a control terminal connected to the injection node and including a second transistor having a control terminal biased with the same bias voltage as the control terminal of a reference transistor of a second current mirror circuit of the current conditioning apparatus.

11. The current conditioning apparatus of claim 1 wherein the differential amplifier includes a safety circuit provided to maintain a voltage drop along each transistor of the differential amplifier within a safe operation voltage range.

12. The current conditioning apparatus of claim 1 wherein the differential amplifier is enabled or disabled in response to an enable control signal applied to a control terminal of a first enable transistor of the differential amplifier being connected via a transistor and resistors to an input transistor of a second current mirror circuit provided in the differential amplifier and applied to a control terminal of a second enable transistor of the differential amplifier being connected to an input transistor of a third current mirror circuit provided in the differential amplifier.

13. The current conditioning apparatus of claim 12 wherein an output transistor of the second current mirror circuit provided in the differential amplifier is connected to a control terminal of a transistor connected in series with a first transistor of a transistor pair provided in the differential amplifier.

14. The current conditioning apparatus of claim 1 wherein the negative feedback loop of the differential amplifier includes capacitors connected to the injection node to provide frequency stability to the negative feedback loop.

15. The current conditioning apparatus of claim 1 wherein the first current mirror circuit comprises N-MOSFETs.

16. The current conditioning apparatus of claim 1 wherein a second current mirror circuit and a third current mirror circuit provided in the differential amplifier comprise N-MOSFETs.

17. The current conditioning apparatus of claim 1 wherein a second current mirror circuit provided in the differential amplifier comprise P-MOSFETs.

18. A signal amplifier comprising:
a multi-level cascode transistor stack with a quiescent bias current provided by a current conditioning apparatus having a current mirror circuit including an input transistor adapted to receive an input current from an injection node and including an output transistor adapted to provide in response to the received input current a replicated output current with a predefined current mirror ratio and having a differential amplifier including at least one differential amplifier current mirror circuit, the differential amplifier being adapted to provide a negative feedback loop between the injection node and a control terminal of the input transistor of the current mirror circuit.

19. A current conditioning apparatus comprising:
a current mirror circuit including an input transistor adapted to receive an input current from an injection node and including an output transistor adapted to replicate in response to the received input current an output current with a predefined current mirror ratio; and
a differential amplifier including at least one differential amplifier current mirror circuit, the differential amplifier being adapted to provide a negative feedback loop between the injection node of the apparatus and a control terminal of the input transistor of the current mirror circuit, the negative feedback loop including capacitors connected to the injection node to provide frequency stability to the negative feedback loop.

20. A current conditioning apparatus comprising:
a current mirror circuit including an input transistor adapted to receive an input current from an injection node and including an output transistor adapted to replicate in response to the received input current an output current with a predefined current mirror ratio; and
a differential amplifier including
at least one differential amplifier current mirror circuit, the differential amplifier being adapted to provide a negative feedback loop between the injection node of the apparatus and a control terminal of the input transistor of the current mirror circuit, and
a safety circuit provided to maintain a voltage drop along each transistor of the differential amplifier within a safe operation voltage range.

* * * * *